(12) United States Patent
Dehe et al.

(10) Patent No.: US 7,994,618 B2
(45) Date of Patent: Aug. 9, 2011

(54) SENSOR MODULE AND METHOD FOR MANUFACTURING SAME

(75) Inventors: Alfons Dehe, Neufahrn (DE); Marc Fueldner, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 732 days.

(21) Appl. No.: 11/559,685

(22) Filed: Nov. 14, 2006

(65) Prior Publication Data

US 2007/0126130 A1 Jun. 7, 2007

(30) Foreign Application Priority Data

Nov. 14, 2005 (DE) .......................... 10 2005 054 177

(51) Int. Cl.
*H01L 23/06* (2006.01)
(52) U.S. Cl. ................. 257/684; 257/E29.324; 257/108; 257/787; 438/116; 73/754
(58) Field of Classification Search ........... 257/E23.043, 257/684, 787, 756, 672, E29.324, 108; 73/754, 73/756, 727, 718; 438/106, 116, 121
See application file for complete search history.

(56) References Cited

U.S. PATENT DOCUMENTS

| | | | | |
|---|---|---|---|---|
| 4,838,089 A * | 6/1989 | Okada et al. | ...................... | 73/727 |
| 4,850,227 A * | 7/1989 | Luettgen et al. | ................. | 73/708 |
| 5,207,102 A * | 5/1993 | Takahashi et al. | ............... | 73/727 |
| 5,424,249 A | 6/1995 | Ishibashi | | |
| 5,859,759 A * | 1/1999 | Moriyama et al. | .......... | 361/283.4 |
| 5,948,991 A * | 9/1999 | Nomura et al. | ................... | 73/727 |
| 6,097,419 A * | 8/2000 | Morris et al. | ................... | 347/237 |
| 6,140,144 A * | 10/2000 | Najafi et al. | .................... | 438/53 |
| 6,201,285 B1 * | 3/2001 | Iwata et al. | .................... | 257/419 |
| 6,401,545 B1 * | 6/2002 | Monk et al. | ..................... | 73/756 |
| 6,441,503 B1 * | 8/2002 | Webster | ....................... | 257/787 |
| 6,534,711 B1 | 3/2003 | Pollack | | |
| 6,962,282 B2 * | 11/2005 | Manansala | ................. | 228/180.5 |
| 7,014,888 B2 * | 3/2006 | McDonald et al. | ........... | 427/558 |
| 7,145,253 B1 * | 12/2006 | Kim et al. | ..................... | 257/790 |
| 7,243,561 B2 * | 7/2007 | Ishigami et al. | ............. | 73/866.1 |
| 7,329,555 B1 * | 2/2008 | Padmanabhan et al. | ........ | 438/51 |
| 7,343,811 B2 * | 3/2008 | Tenerz et al. | ................... | 73/756 |

* cited by examiner

*Primary Examiner* — Chris Chu
(74) *Attorney, Agent, or Firm* — Eschweiler & Associates, LLC

(57) ABSTRACT

A sensor module has a carrier substrate having a bottom side and a top side, a sensor chip arranged on the top side of the carrier substrate and having a pressure-sensitive active area, a signal-processing chip arranged on the top side of the carrier substrate next to the sensor chip and being connected to the sensor chip in an electrically conducting manner, a continuous casting material covering the top side of the carrier substrate and the signal-processing chip and being in mechanical contact with both, the casting material having a recess which is arranged such that the casting material does not cover at least a part of the active area of the sensor chip.

4 Claims, 4 Drawing Sheets

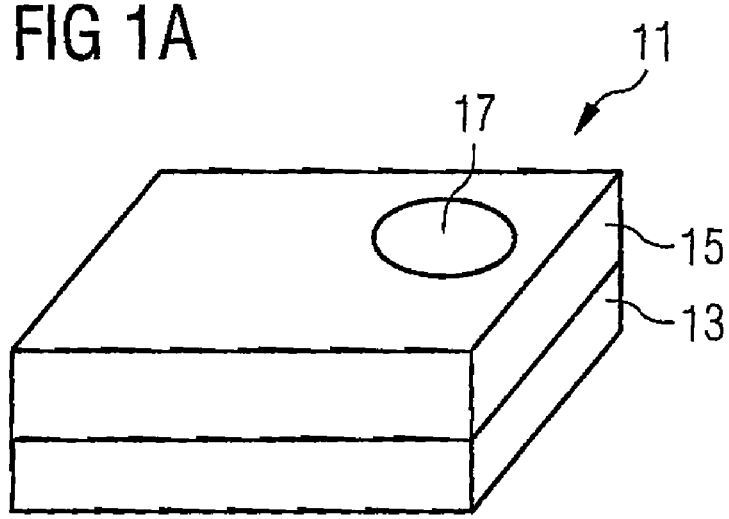
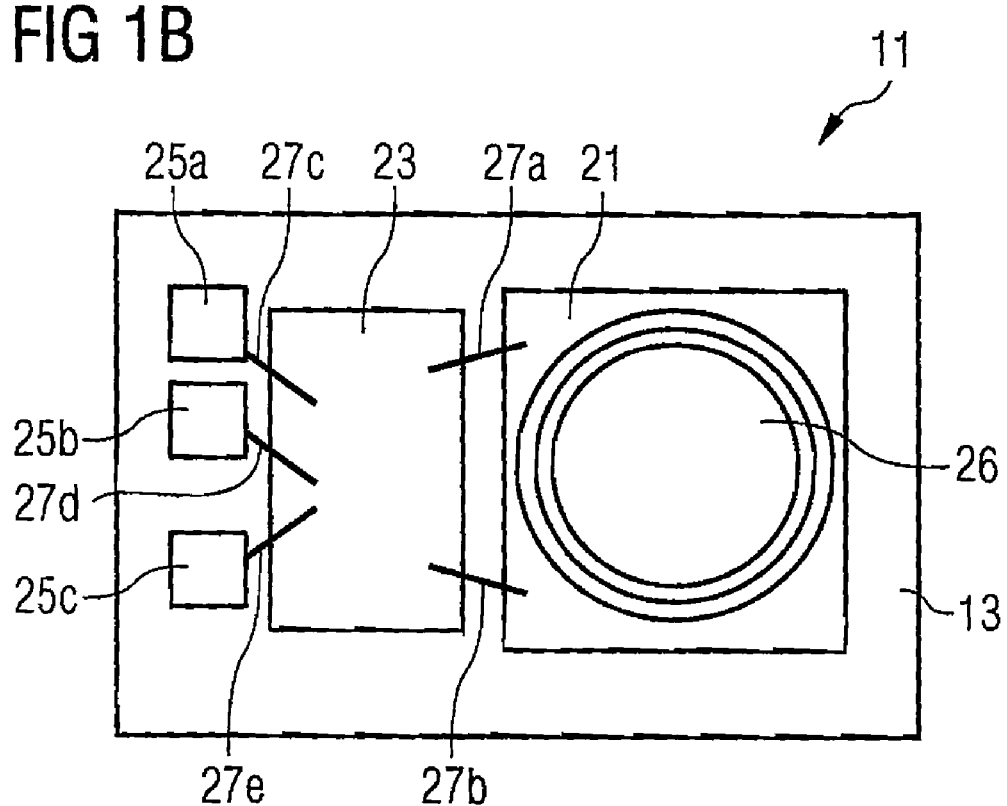

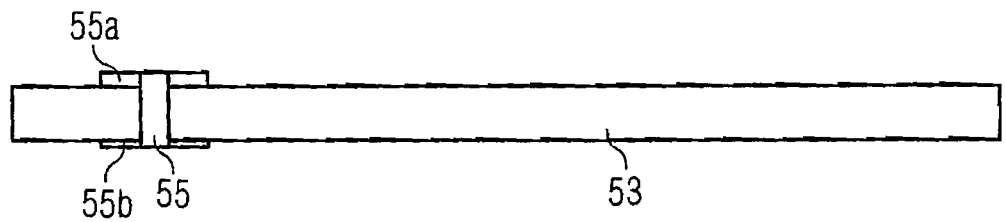
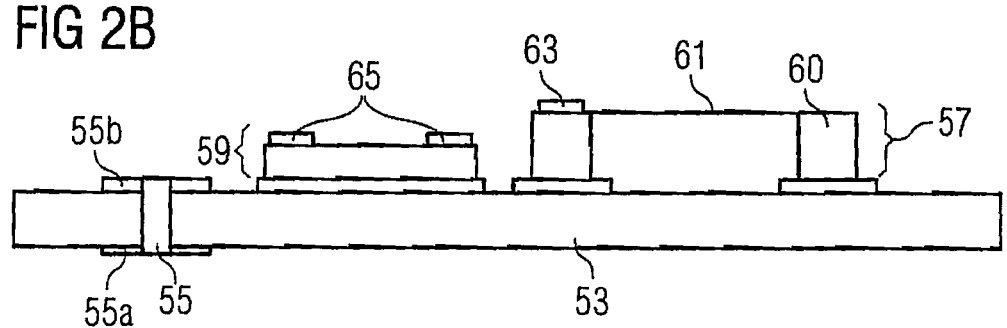
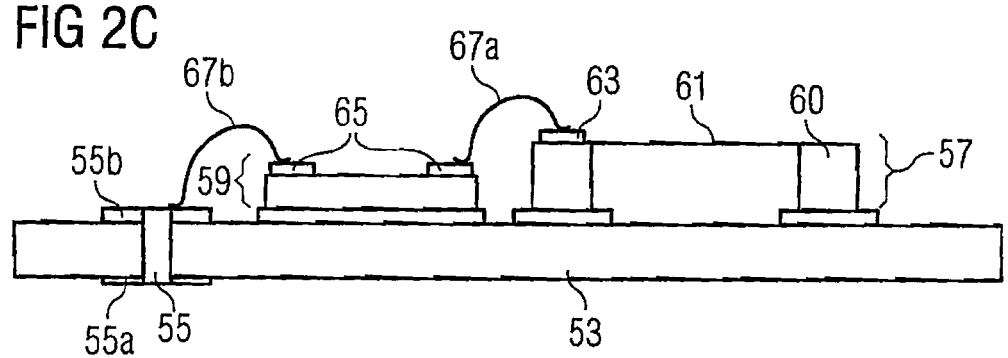

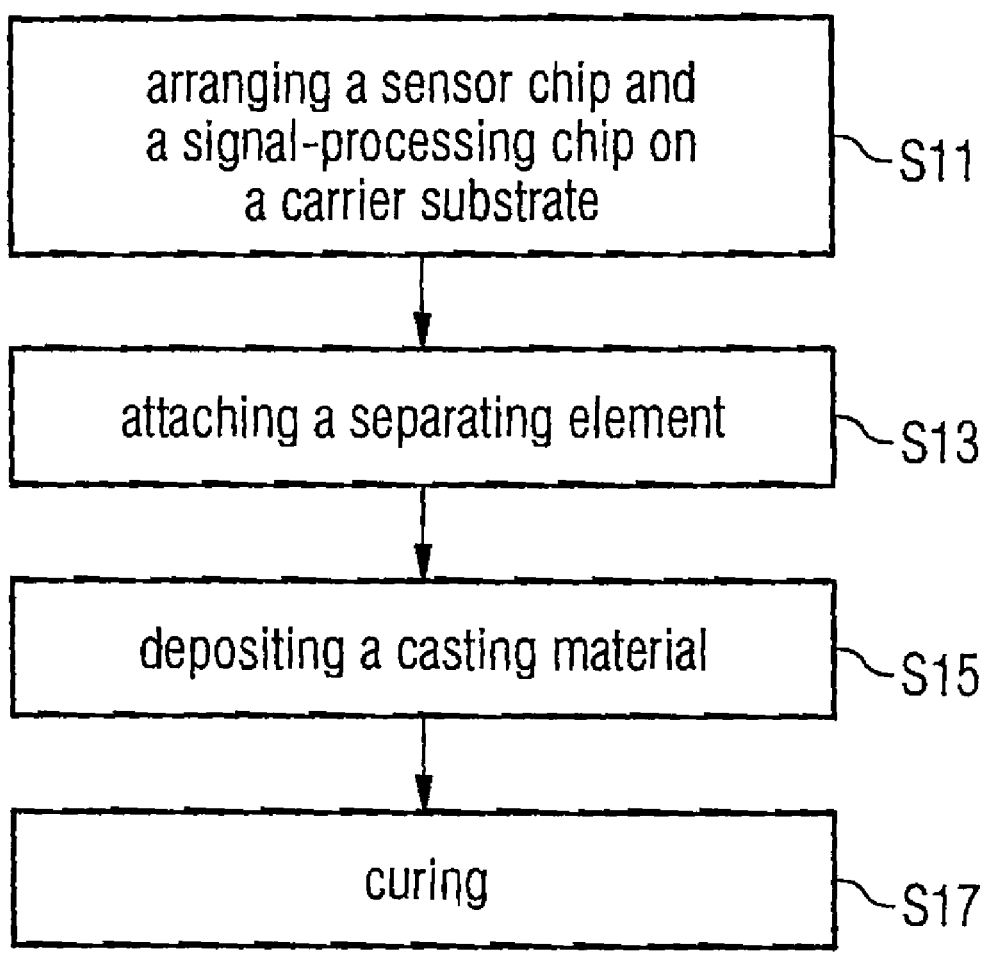

SENSOR MODULE AND METHOD FOR MANUFACTURING SAME

RELATED APPLICATIONS

This application claims priority from German Patent Application No. 10 2005 054 177.1, which was filed on Nov. 14, 2005, and is incorporated herein by reference in its entirety.

TECHNICAL FIELD

The present invention relates to a sensor module and to a method for manufacturing same.

BACKGROUND

Sensors, such as, for example, optical sensors exemplarily comprising LEDs or photodiodes, are more frequently implemented in special package technologies to allow a light wave or light beam easy entry to a sensor element in the package. Acoustic sensors, too, such as, for example, microphones, where an acoustic wave is to impinge on a sensor element with the least interference possible, or pressure sensors where a pressure or pressure change is to propagate to a sensor element in a package with the least interference possible are also implemented in special package technologies.

An article by M. Müllenborn et al. at EUROSENSORS XIV, Aug. 27 to 30, 2000, Copenhagen, Denmark, discusses a setup of stacked silicon microphones. In the stacked silicon microphones, a microphone chip is deposited "head first" on a carrier chip serving as the substrate. The contacts of the microphone chip here are arranged on a surface of the microphone chip looking away from the carrier chip. Subsequently, an interconnect chip is deposited on the microphone chip by means of chip-to-wafer bonding or wafer-to-wafer bonding. The interconnect chip comprises a recess through which an acoustic wave may propagate. After that, an ASIC (application-specific integrated circuit) processing the signals from the microphone chip is deposited on the interconnect chip for example by means of chip-to-wafer bonding. In addition, a sound inlet pipe is deposited on the interconnect chip so that a sound wave may propagate from the surroundings through the recess in the interconnect chip to a membrane on the microphone chip. The setup generated in this way is finally sprayed with a conductive polymer so that the shielding formed in this way creates mechanical protection and electromagnetic shielding.

However, it is of disadvantage with this method of manufacturing where the silicon chips are deposited "head first" on a carrier substrate that the contacts thereof are arranged on a surface looking away from the carrier chip so that the manufacturing costs are very high. With these so-called chip-size packages manufactured by means of chip bonding, the silicon chips themselves form the package and the positions of the contacts on the chips and the positions of the vias in the interconnect chip and thus the layout need to be adjusted individually for every type of microphone implemented.

This is why the developing costs for a stacked silicon microphone are very high and a microphone implemented in this way has very low flexibility in its package design or layout of the package dimensions. The microphone chip and the interconnect chip must be adjusted, as far as the layout is concerned, individually for every electrical apparatus making use of such a microphone and making special requirements to the dimensions of the microphone.

WO 02/45463/A2 shows a micromechanical silicon microphone the package of which is produced using a substrate in combination with a lid. The substrate here serves as a carrier or carrier substrate for one or several silicon chips, whereas the lid shields the device from the surroundings. An opening is provided in the substrate or the lid as a sound inlet. A silicon-capacitor microphone and an amplifier chip are positioned in the package formed in this way.

An article by J. Bergqvist and F. Rudolf at Sensors and Actuators, A45, 1994, on pages 115-124, deals with silicon-capacitor microphones employing bond technologies and backside etching technologies. Thus, a microphone chip having a pressure-sensitive membrane and an acoustically transparent back plate is arranged in a package. The package consists of a conductive circuit board having a pressure inlet and a metal cap.

Disadvantages of silicon-capacitor microphones implemented in this way are the increased demand of material for the lid and the carrier substrate or printed circuit board and the increased demand of space making a flexible usage of the microphone difficult in applications critical as to space. Several process steps may be executed in parallel with this concept, but nevertheless protecting the silicon chip or silicon microphone entails increased complexity and costs since this is frequently performed in two method steps. The structures susceptible to corrosion are at first cast, and subsequently a lid is deposited as a protection against mechanical influence.

DE 103 03 263 A1 shows a sensor module. The sensor module consists of a microphone chip arranged in a package which is formed of a package lid and a carrier material. The package is deposited on a printed circuit board by means of a solder connection. In the carrier material, the package has a sound inlet opening opposite a hole in the printed circuit board.

This setup of a sensor module, too, has the disadvantages of a high demand of material for the printed circuit board and the lid, increased processing complexity and increased demand of space for the microphone implemented in this way.

An article by Dr. M. Füildner and Dr. A. Dehè at zwölfte GNA/ITG-Fachtagung Sensoren und Messsysteme 2004, Ludwigsburg, March 2004, having the title "Mikromechanische Silizium-Mikrophone" deals with silicon microphones. The conventional sensor modules or silicon microphones discussed there exhibit SMD demonstrators accommodated on a through-contacted FR4 substrate having a molded cap or cap produced by means of an injection molding process or in a premold hollow package. The sound inlet here is via a hole on the bottom or in the FR4 substrate.

Again, is it of disadvantage with this setup of the conventional sensor module that depositing materials, such as, for example, connective materials, casting compounds or the lid, is performed individually for each device or each sensor module during manufacturing, resulting in increased manufacturing costs. In addition, the package is produced in a complicated manner by depositing a lid on a substrate or printed circuit board.

Packages having a lid with a sound hole additionally are of disadvantage in that an acoustic resonator will form. Similarly to the spring-and-mass principle in mechanics, the sound hole may be considered to be an acoustic mass and the volume behind it, i.e. the volume in the package between the substrate and the lid, may be considered to be an acoustic spring. The bandwidth of the microphone is reduced or limited by forming this resonator. At the same time, the demand of space for a microphone embodied in this manner is increased, since a minimal size is determined by reservations or tolerances or a distance from the chips to the lid and a minimal width or thickness of the lid.

SUMMARY

A sensor module may have a carrier substrate having a bottom side and a top side, a sensor region arranged on the top side of the carrier substrate and having a pressure-sensitive active area, a signal-processing chip on the top side of the carrier substrate and electrically connected to the sensor region, and a continuous casting material covering the top side of the carrier substrate and the signal-processing chip and being in mechanical contact with both, wherein the casting material has a recess which is arranged such that the casting material does not cover at least a part of the active area of the sensor region.

BRIEF DESCRIPTION OF THE DRAWINGS

Different embodiments will be detailed subsequently referring to the appended drawings, in which:

FIG. 1A shows a microphone module according to an embodiment;

FIG. 1B is a sectional view of the microphone module according to an embodiment shown in FIG. 1a;

FIGS. 2A-2E are schematic views of a microphone module manufactured according to a method for manufacturing according to an embodiment; and FIG. 3 shows a flow chart of a method for manufacturing a sensor module according to an embodiment.

DETAILED DESCRIPTION

Figure 2D:
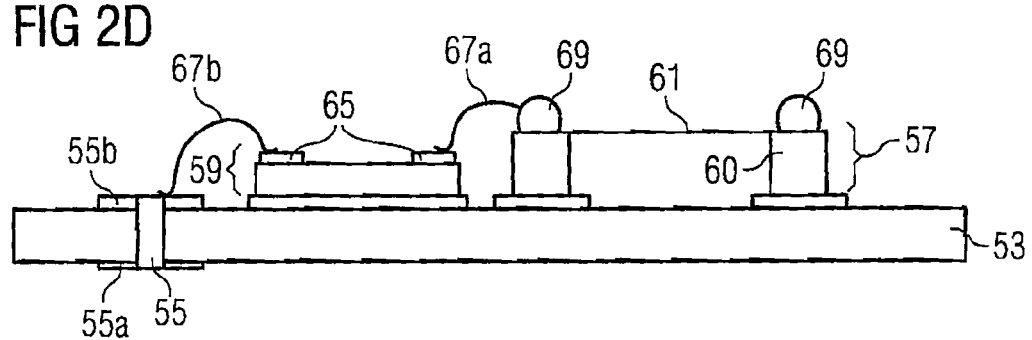

According to another embodiment, a method for manufacturing a sensor module may have the steps of producing a sensor region having a pressure-sensitive active area and arranging a signal-processing chip on a top side of a carrier substrate, attaching a separation element separating a recess region not to be covered by a casting material with a part of the active area from a region to be covered by the casting material, depositing the casting material on the top side of the carrier substrate and the signal-processing chip, no casting material being deposited in the recess region, and curing the casting material.

In a sensor module in which a sensor chip comprises a pressure-sensitive active area and a signal-processing chip arranged next to each other on a top side of a carrier substrate, a continuous casting material covers a top side of the carrier substrate and the signal-processing chip such that it is in mechanical contact with both and may comprise a recess so that the casting material does not cover at least a part of the active area of the sensor chip.

Thus, sensor modules can be provided in which the devices fixed on a substrate, such as, for example, a silicon chips or discrete devices, may be covered or cast in a simple and cheap manner by a casting material serving as a protection against corrosion and, at the same time, as mechanical protection. However, at the same time, a pressure-sensitive area of a sensor chip is not covered by the casting material so that the sensor module can continue determining a pressure by means of the exposed of the pressure-sensitive region. Thus, the sensor module according to an embodiment is easier and cheaper to manufacture than the conventional sensor module. The casting material protects the device against environmental influences so that the casting material takes over the same functions a package does.

At the same time, a demand for space of the sensor module according to an embodiment which is covered only by a casting material is reduced compared to the conventional sensor module implemented in a package made of a substrate and a lid. The sensor module according to an embodiment may thus be employed more flexibly in electrical apparatuses in which sensor modules having small package forms are to be used.

In addition, the sensor module according to an embodiment has an increased bandwidth due to the small package volume. Due to the small package volume and/or the small cavities, there is no acoustic resonator forming on the sensor module according to an embodiment so that the acoustic bandwidth of the sensor module is increased.

FIG. 1A shows a microphone module 11 according to an embodiment. The microphone module 11 comprises a printed circuit board 13, a casting material 15 and a hole 17. The casting material 15 is positioned on the surface of the printed circuit board 13. Thus, the casting material 13 in the microphone module 11 according to an embodiment only covers a top side of the printed circuit board 13, whereas the side faces of the printed circuit board 13 and the bottom side are not covered by the casting material 15. The casting material 15 here is in mechanical contact with the printed circuit board 13 and thus adheres to the surface of the printed circuit board 13.

FIG. 1B explains a sectional view of the microphone module 11 according to an embodiment. A microphone chip 21, an amplifier chip 23 and three electrical contacts 25a-c are arranged on the printed circuit board 13. The amplifier chip 23 and the microphone chip 21 thus are arranged next to each other on a top side of the printed circuit board 13.

FIG. 1b explains a sectional view of the microphone module 11 according to an embodiment. A microphone chip 21, an amplifier chip 23 and three electrical contacts 25a-c are arranged on the printed circuit board 13. The amplifier chip 23 and the microphone chip 21 thus are arranged next to each other on a top side of the printed circuit board 13.

The microphone chip 21 has a membrane 26 which is circular here. Furthermore, two bond wires 27a-b are each attached to a pad on the top side of the amplifier chip 23 and of the microphone chip 21 so that the bond wires extend from the microphone chip 21 to the amplifier chip 23. Electrical connection between the microphone chip 21 and the amplifier chip 23 is made via the bond wires 27a-27b. At the same time, three bond wires 27c-e are attached to the contacts 25a-c on the printed circuit board 13 and to contact pads on the amplifier chip 23 not shown here so that the bond wires 27c-e extend from the contacts 25a-c on the printed circuit board 13 to the contact pads on the amplifier chip 23. Electrical connection between the contacts 25a-c on the printed circuit board 13 and the contact pads on the amplifier chip 23 is made via the respective bond wires 27c-e. The bond wires 27a-e here are surrounded completely by the casting material 15, wherein the casting material 15 is in mechanical contact to the bond wires. Additionally, the casting material 15 covers the contacts 25a-c on the printed circuit board 13 and also is in mechanical contact thereto.

A sound wave enters through the hole 17 in the casting material 15 shown in FIG. 1a and impinges on the membrane 26 of the microphone chip 21. Depending on the intensity of the sound wave, an electrical signal transmitted via the bond wires 27a, b to the amplifier chip 23 is generated in the microphone chip 21. In the amplifier chip 23, the electrical signal is processed and/or filtered or amplified and subsequently transmitted via the bond wires 27c-e to the contacts 25*a*-*c* on the printed circuit board. At the same time, a voltage supply of the amplifier chip may be made via the bond wires 27*c*-*e*.

The electrical contacts 25*a*-*c* on the printed circuit board 3 may thus additionally be electrically connected to amplifier stages of switching elements not shown here so that the electrical signal depending on the sound intensity can be processed in an electrical apparatus.

Thus, the signal-processing chip 23, the carrier substrate 13 and/or the contacts 25*a*-*c* on the carrier substrate and the bond wires 27*a*-*b* and bond pads on the chip not shown here are protected against environmental influences which may, for example, result in corrosion of the contacts, by the casting material 15. A lid protecting the signal-processing chip and the carrier substrate and, in particular, the contacts on the carrier substrate from environmental influences or mechanical damage is no longer required, in contrast to the conventional sensor module.

Subsequently, a method for manufacturing a microphone module according to an embodiment will be discussed referring to FIGS. 2A-2E. FIG. 2A shows a substrate 53 having a contact hole 55 through the substrate 53. The contact hole 55 connects a contact 55*a* on the bottom side of the substrate 53 to a contact 55*b* on the top side of the substrate. Connective materials are deposited onto the substrate 53 shown in FIG. 2A by any printing techniques. The microphone chip 57 and the amplifier chip 59 are deposited next to each other on a top side on the substrate 53 by means of the connective material deposited. Depositing here may, for example, take place by means of gluing or soldering. Thus, the microphone chip 57 comprises a substrate 60, a membrane 61 and a microphone chip terminal 63. The amplifier chip 59 comprises electrical terminals 65 on its top side. The result is the setup shown in FIG. 2B.

Subsequently, electrical connections are produced by means of wire bonding. Here, a bond wire 67*a* is attached to the microphone chip terminal 63 and to the amplifier chip terminal 65 so that an electrical connection is made between the microphone chip 57 and the amplifier chip 59 via the terminals 63, 65 and the bond wire 67*a*. Also, a bond wire 67*b* is attached to the terminal 65 of the amplifier chip 59 and to the contact 55*b* on the top side of the substrate 53. Thus, a conducing connection between the contact hole 55 and the amplifier chip 59 is made via the terminal 65, the bond wire 67*b* and the contact 55*b*. The result is the setup shown in FIG. 2C.

After that, a viscous dispensed protective dam material is applied onto the substrate of the microphone 60. The protective dam material is subsequently solidified in a temperature step or curing. Thus, the result is a protective dam laterally enclosing the membrane 61 and/or the sensor area of the microphone chip 60. The setup resulting is shown in FIG. 2D.

Subsequently, a casting material 71 is deposited onto the substrate 53, the amplifier chip 59 and the microphone chip 57. Thus, the casting material 71 is deposited such that it does not cover the region enclosed by the protective dam 69 where the membrane 61 is arranged. When depositing the casting material 71, the substrate 53 is preferably cast by a preferably low-viscous material or casting material 71 up to the height of the dam so that the casting material 71 is in mechanical contact with the top side of the substrate 53 and the amplifier chip 59. Thus, the casting material 71 covers the top side of the substrate 53, the amplifier chip 59 and the microphone chip 57, except for the active area 61.

Figure 2E:
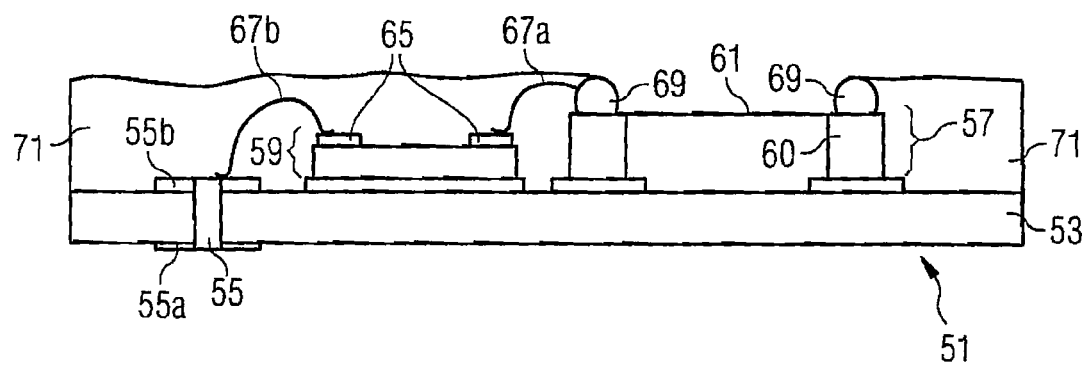

Subsequently, the casting material 71 is solidified in a temperature step and/or a step of curing at increased temperature. The casting material 71 thus protects the silicon chip 57, 59, i.e. the microphone chip 57 and the amplifier chip 59, but at the same leaves the membrane 61 exposed due to the lateral enclosure by the protective dam 69. The setup of the microphone module 51 produced in this way is shown in FIG. 2*e*.

Smaller or minimal sizes can be achieved by the manufacturing method according to an embodiment used here compared to conventional microphones since, both laterally and as far as height is concerned, the reservations present in conventional microphones can be saved. In addition, the manufacturing method according to an embodiment shown in FIGS. 2A-2E can be performed in a cost-effective manner by the techniques of the so-called COB (chip-on-board) technique in parallel for several devices, which is how the manufacturing costs can be reduced.

FIG. 3 explains a manufacturing method for a sensor module according to an embodiment. In step S11, a sensor chip having a pressure-sensitive active area, such as, for example, a membrane, and a signal-processing chip are arranged next to each other on a top side of a carrier substrate. Subsequently, in step S13 a separating element is deposited onto the sensor chip, the signal-processing chip or the substrate or carrier substrate. The separating element thus is arranged such that is separates a recess region not to be covered by a casting material in a subsequent step and comprising the pressure-sensitive active area from a region to be covered by the casting material.

After that, in step S15 the casting material is deposited onto the top side of the carrier substrate and the signal-processing chip, no casting material being deposited in the recess region which is separated by the separating element. The casting material may thus also cover a surface of the sensor chip. Then, in step S17 the casting material is cured. The curing step here may, for example, be performed by a temperature step.

In above embodiments, a sensor module in FIG. 1B is implemented as a microphone module. However, any pressure-sensitive sensor modules are alternatives. Furthermore, a microphone chip having a membrane 26 is arranged in the microphone module 11 according to an embodiment. However, any pressure-sensitive chips having a pressure-sensitive active area are alternatives. In the microphone module 11 according to an embodiment, the number of bond wires between the amplifier and the microphone is 2, however, any numbers of bond wires between the amplifier chip and the microphone chip are alternatives. Also, the amplifier chip 23 may be any signal-processing chip in the microphone module according to an embodiment. Furthermore, the amplifier chip 23 in the microphone module according to an embodiment may be connected to any number of contacts on the printed circuit board 13 via any number of bond wires.

In the microphone module 11 according to an embodiment, the number of contacts of the printed circuit board 13 is three, and the number of bond wires between the contacts on the printed circuit board and the amplifier chip 23 is also three. However, any numbers of contacts on the printed circuit board and the bond wires between the contacts on the printed circuit board and the amplifier chip 23 are alternatives.

In the manufacturing method according to an embodiment, connective materials are preferably deposited by means of so-called printing techniques in large-area substrates having many devices. However, any methods for depositing the connective materials are alternatives. Also, in the manufacturing method according to an embodiment, any pressure-sensitive sensor chip may be deposited as an alternative to the microphone chip, and any signal-processing chip may be deposited as an alternative to the amplifier chip.

Furthermore, any number of further chips or discrete devices may be deposited onto the substrate 53 in the microphone module 11 according to an embodiment as an alternative. Additionally, in the microphone module 11 according to an embodiment, the microphone chip and/or the sensor chip may be omitted and instead a sensor region may be arranged for example on the amplifier chip 23 or on the printed circuit board 13.

In the manufacturing method according to an embodiment, the microphone chip and the amplifier chip might also not be deposited on the substrate 53 by gluing or soldering by means of connective material but, for example, be fixed mechanically to a solder bump on the substrate 53 by means of a flip-chip technique. Subsequently, bond wires in turn may be attached to the terminals 63, 65 to electrically connect the amplifier chip to the contact hole, or the contacting of the chips 57, 59 might also be via the connections between the substrate 53 and the chips 57, 59 realized in flip-chip technology. Preferably, when subsequently depositing the casting material 71, the flip-chip contact on the substrate 53 and/or the solder contact on the carrier substrate is covered by the casting material so that the casting material 71 is in mechanical contact to the flip-chip contact.

In the manufacturing method according to an embodiment, the protective dam 69 is preferably formed of another material than the casting material 71. However, the protective dam 69 and the casting material 71 may be formed of the same material, wherein at first the material of the protective dam 69 would be deposited and cured subsequently, and then the casting material 71 would be deposited. The protective dam 69 here may, for example, consist of a silicon material, however, any materials being alternatives. Silicones or epoxy resins may preferably be used as casting materials, any materials, however, being alternatives.

The casting material in the microphone module according to an embodiment preferably has a viscosity value below a viscosity of 100 Pa*sec or 100 Pascal per second, any values of the viscosity of the casting material, however, being alternatives.

In the method steps of a manufacturing method according to an embodiment illustrated in FIGS. 2C-2D, the protective dam 69 is applied to protect the sensor area or membrane 61 from being covered by the casting material 71. Alternatively, a glued die or press-on die or a stamp may be contacted with the setup shown in FIG. 2C so that the sensor area is not covered by the casting material. After depositing the casting material or after curing, the stamp would be removed again. Alternatively, a dye contacted with the setup shown in FIG. 2C might subsequently also remain on the sensor as a socket to form the boundaries of the sound inlet in the microphone module 51.

In the manufacturing method, a single pressure-sensitive sensor module is manufactured according to an embodiment. However, alternatively any number of microphone chips 57 and amplifier chips 59 may be implemented next to one another on a large-area substrate so that the result in several portions of the substrate 53 arranged next to one another is the setup shown in FIG. 2A. The method steps shown in FIGS. 2A-2E may then be executed in parallel on the regions or portions arranged next to one another on the large-area substrate, wherein the step of depositing the casting material shown in FIGS. 2D-2E may be performed in parallel on several devices.

In this case, the substrate would be diced in a final production step according to the device dimensions or the dimensions of the respective sensor modules. Dicing may thus be performed by sawing or milling. However, any methods for dicing electrical devices are alternatives. Preferably, when dicing the devices, if this is performed by sawing the wafer, the substrate 53 is deposited "head first" on a sawing foil so that the sensor area is protected when sawing.

On the sensor module according to an embodiment shown in FIG. 2E, alternatively a sound-transparent layer or a transparent layer, such as, for example, a plate provided with holes, a foil or felt may be applied above the membrane 61, after casting or depositing the casting material 71. Thus, the membrane 61 in the microphone module 51 according to an embodiment would be protected from external influence.

In the microphone module 11 according to an embodiment shown in FIG. 1A, the printed circuit board 13 is preferably formed of a plastic material. More preferably, a cost-effective organic printed circuit board substrate of, for example, an FR4 material, is used here. However, any materials from which the printed circuit board and/or the carrier substrate may be formed, are alternatives. The microphone module according to an embodiment shown in FIG. 1A preferably comprises an upper cut-off frequency in a range from 25 kHz to 100 kHz. However, any upper cut-off frequencies of the microphone module 11 are alternatives.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A sensor module comprising:
   a carrier substrate comprising a bottom side and a top side;
   a sensor region arranged on the top side of the carrier substrate and comprising a pressure-sensitive active area;
   a signal-processing chip arranged on the top side of the carrier substrate and electrically connected to the sensor region; and
   a continuous casting material covering the top side of the carrier substrate and the signal-processing chip and being in mechanical contact to both, the casting material comprising a recess which is arranged such that the casting material does not cover at least a part of the active area of the sensor region,
   wherein a dam separating the recess region from the casting material and comprising a dam material different from the casting material is arranged between the casting material and the recess region.

2. A sensor module comprising:
   a carrier substrate comprising a bottom side and a top side;
   a sensor region arranged on the top side of the carrier substrate and comprising a pressure-sensitive active area;
   a signal-processing chip arranged on the top side of the carrier substrate and electrically connected to the sensor region; and
   a continuous casting material covering the top side of the carrier substrate and the signal-processing chip and being in mechanical contact to both, the casting material comprising a recess which is arranged such that the casting material does not cover at least a part of the active area of the sensor region,
   wherein a pipe-shaped body separating the recess region from the casting material and comprising a different material from the casting material is arranged between the casting material and the recess region, the pipe-shaped body being designed to adjust a pressure at the pressure-sensitive active area to the atmospheric pressure.

3. A sensor module comprising:
a carrier substrate comprising a bottom side and a top side;
a sensor region arranged on the top side of the carrier substrate and comprising a pressure-sensitive active area;
a signal-processing chip arranged on the top side of the carrier substrate and electrically connected to the sensor region; and
a continuous casting material covering the top side of the carrier substrate and the signal-processing chip and being in mechanical contact to both, the casting material comprising a recess which is arranged such that the casting material does not cover at least a part of the active area of the sensor region,
wherein the sensor chip comprises a microphone and the sensor module is implemented as a microphone module, and
wherein the microphone module comprises a bandwidth region in which a microphone sensitivity is increased and an upper cut-off frequency value of the bandwidth region is in a range from 25 kHz to 100 kHz.

4. The sensor module according to claim 3 wherein the carrier substrate comprises a plastic material.

* * * * *